(12) United States Patent
Yamaguchi

(10) Patent No.: US 6,858,947 B2
(45) Date of Patent: Feb. 22, 2005

(54) SEMICONDUCTOR DEVICE

(75) Inventor: Tadashi Yamaguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/020,153

(22) Filed: Dec. 18, 2001

(65) Prior Publication Data

US 2003/0205791 A1 Nov. 6, 2003

(30) Foreign Application Priority Data

Jun. 11, 2001 (JP) .................................... P2001-175476

(51) Int. Cl.[7] ............................................ H01L 23/544
(52) U.S. Cl. .................... 257/797; 257/676; 257/777; 257/782; 257/783; 257/787
(58) Field of Search ................................ 257/676, 777, 257/782, 783, 787, 797

(56) References Cited

U.S. PATENT DOCUMENTS

| | | | | |
|---|---|---|---|---|
| 4,918,511 A | * | 4/1990 | Brown | 257/669 |
| 5,021,865 A | * | 6/1991 | Takahashi et al. | 257/676 |
| 5,637,913 A | * | 6/1997 | Kajihara et al. | 257/666 |
| 5,757,068 A | * | 5/1998 | Kata et al. | 257/668 |
| 5,874,773 A | * | 2/1999 | Terada et al. | 257/676 |
| 5,920,117 A | * | 7/1999 | Sono et al. | 257/675 |
| 6,130,115 A | * | 10/2000 | Okumura et al. | 438/124 |
| 6,278,193 B1 | * | 8/2001 | Coico et al. | 257/797 |
| 6,326,243 B1 | * | 12/2001 | Suzuya et al. | 438/124 |
| 6,396,142 B1 | * | 5/2002 | Ito et al. | 257/712 |

FOREIGN PATENT DOCUMENTS

| | | | |
|---|---|---|---|
| JP | 60-136232 | | 7/1985 |
| JP | 60-245224 | | 12/1985 |
| JP | 64-064227 | | 3/1989 |
| JP | 02007536 A | * | 1/1990 |
| JP | 05-109918 | | 4/1993 |
| JP | 06-005729 | | 1/1994 |
| JP | 08-172111 | | 7/1996 |
| JP | 9-069537 | | 3/1997 |
| JP | 10004151 A | * | 1/1998 |
| JP | 10-326951 | | 12/1998 |
| JP | 11-312760 | | 11/1999 |

\* cited by examiner

*Primary Examiner*—Bradley Baumeister
*Assistant Examiner*—Chris C. Chu
(74) *Attorney, Agent, or Firm*—Rabin & Berdo, P.C.

(57) ABSTRACT

In order to provide a semiconductor device which makes it possible to mount a semiconductor element on the substrate of the semiconductor device main body at the correct position with a higher degree of accuracy, a semiconductor element 2 is mounted at a circuit forming surface of a semiconductor substrate 1 at the periphery of which pad electrodes 5 are provided and a specific area in the semiconductor device containing the semiconductor element 2 is sealed with resin. At the circuit forming surface of the semiconductor substrate 1, reference lines 3 are formed in correspondence to the positions of at least three corners of the semiconductor element 2 to be mounted.

21 Claims, 10 Drawing Sheets

SEMICONDUCTOR DEVICE

BACKGROUND OF THE INVENTION

1. Field of the Invention

The present invention relates to a semiconductor device, and more specifically, it relates to a compact semiconductor device, a typical example of which is a BGA (ball grid array) semiconductor device.

2. Description of the Related Art

There has been an increasing need for achieving miniaturization and a lower profile in an integrated circuit package constituted by packaging semiconductor elements such as semiconductor integrated circuits. In response to this need, a BGA-type semiconductor device achieved by providing spherical terminals such as solder in a grid at the lower surface of a multiple-terminal semiconductor integrated circuit package has been proposed.

FIG. 10 shows the structure adopted in the BGA semiconductor device mentioned above. As shown in FIG. 10(a), a semiconductor element 802 is secured with an adhesive (not shown) or the like at the center of the upper surface of a substrate 801 of the semiconductor device main body. In addition, at the periphery of the substrate of the semiconductor device main body, a plurality of pad electrodes 806 are provided and are electrically connected with electrodes 807 at the semiconductor element 802 via wirings 803 which may be constituted of, for instance, Au.

As illustrated in FIG. 10(b), a specific range containing the semiconductor element is defined through sealing on the substrate of the semiconductor device main body by using resin 804. In addition, ball electrodes 805 constituted of solder or the like are formed at specific positions of the lower surface of the substrate 801 of the semiconductor device main body.

However, a recognition error may occur with regard to the position at which the semiconductor element is bonded onto the substrate of the semiconductor device in the related art and, in such a case, the semiconductor element may not be secured at a perfectly accurate position. If the semiconductor element is mounted at the wrong position, a problem of wire shorting or the like arises. In addition, since the substrate of the semiconductor device is normally used as a common substrate at which semiconductor elements of varying sizes and types are mounted, it is difficult to mount the various semiconductor elements at their semiconductor element mounting positions with a higher degree of accuracy. There is another issue to be addressed in that as the number of wires connected to the semiconductor device increases, the semiconductor elements need to be mounted at the exact mounting positions with an even higher degree of accuracy.

SUMMARY OF THE INVENTION

Accordingly, an object of the present invention is to provide a new and improved semiconductor device and a manufacturing method thereof, that make it possible to mount a semiconductor element at the correct mounting position on a substrate of a semiconductor device main body with a higher degree of accuracy.

In order to achieve the object described above, in an aspect of the present invention, A semiconductor device comprising; a semiconductor substrate formed reference lines at a circuit forming surface with a pad electrode provided at the periphery thereof, in correspondence to the positions of at least three corners of a semiconductor element to serve as reference marks indicating positions at which semiconductor elements of varying sizes are to be mounted, a semiconductor element mounted at said circuit forming surface of said semiconductor substrate, resin that seals a specific area on said semiconductor substrate containing said semiconductor element is provided.

According to the invention described above in which reference lines are formed in alignment with the three corners of the semiconductor element on the circuit forming surface of the semiconductor substrate, it is possible to verify the correct position at which the semiconductor element is to be mounted with a higher degree of accuracy by utilizing, for instance, a TV camera. As a result, the semiconductor element can be mounted at the correct position with a higher degree of accuracy simply by aligning the corners of the semiconductor element to the reference lines. It is to be noted that since these reference lines indicate the positions at which the three corners of the semiconductor element of any of varying sizes should be set, the semiconductor element can be accurately mounted at the correct position simply by positioning the three corners of the semiconductor element in the vicinity of the reference lines as long as the semiconductor element has a roughly square shape or a rectangular shape.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Figure 1A:
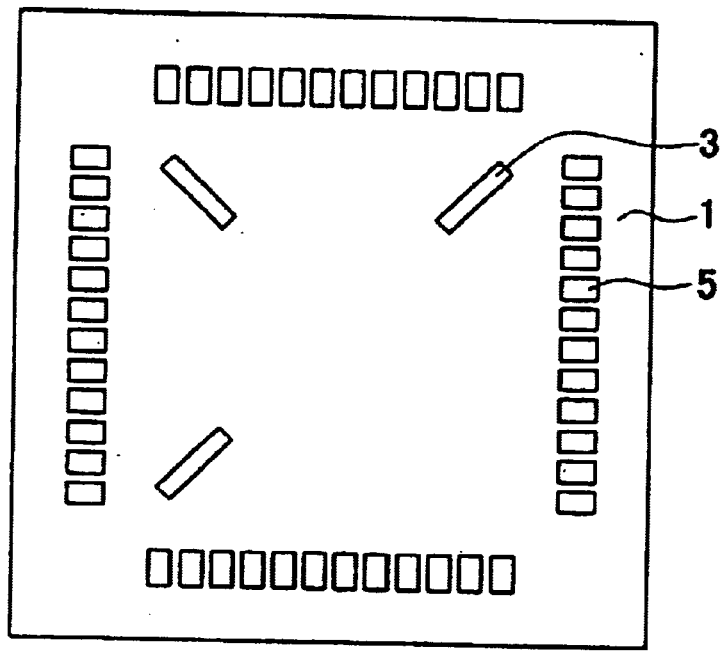
FIGS. 1(a) and 1(b) presents top views of the structure adopted in the semiconductor device achieved in a first embodiment.

The following is a detailed explanation of the preferred embodiments of the present invention, given in reference to the attached drawings. It is to be noted that the same reference numerals are assigned to components having identical functions and structural features in the following explanation and the attached drawings to preclude the necessity for a repeated explanation thereof.

First Embodiment

First, the structure adopted in the semiconductor device in the first embodiment is explained in reference to FIG. 1. FIG. 1 presents top views of the structure of the semiconductor device achieved in the embodiment.

First, as shown in FIG. 1(a), three reference lines indicating three corners of a semiconductor element 2 to be mounted are formed at a surface of a substrate 1 constituting the semiconductor device main body on diagonals extending toward the corners of the device through silk-screen printing or the like. It is to be noted that silk-screen printing refers to one of the intaglio printing methods, that uses a plate prepared by filling the peripheries of symbols such as characters formed in a fabric material with resin or the like and makes an imprint by directly applying ink or the like through the fabric (the fabric used to be silk, hence the name).

Figure 1B:
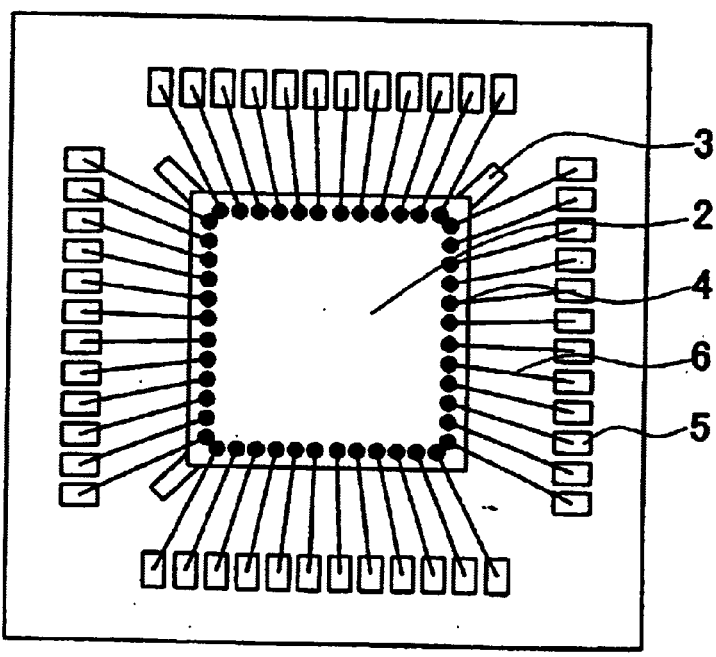

In addition, as illustrated in FIG. 1(b), the semiconductor element 2 is mounted at a specific position near the center of the surface of the substrate 1 constituting for instance, achieving a high degree of accuracy. Electrode portions 4 of the mounted semiconductor element 2 and pad electrodes 5 on the substrate at the semiconductor device main body are electrically connected with each other via wirings 6. As in the semiconductor device in the related art, a specific area containing the semiconductor element is sealed with resin (not shown), with ball electrodes (not shown) which may be constituted of solder or the like formed at specific positions at the lower surface of the semiconductor device substrate.

Next, the semiconductor device manufacturing method achieved in the embodiment is explained.

First, as illustrated in FIG. 1(a), the reference lines 3 indicating the positions of the three corners of the semiconductor element 2 to be mounted are formed at the surface of the substrate 1 constituting the semiconductor device main body on the diagonals extending toward the corners of the device through silk-screen printing or the like. Then, an adhesive is applied onto a specific area in order to secure the semiconductor element 2 at the mounting area over which the semiconductor element 2 is to be mounted (not shown).

Next, as shown in FIG. 1(b), the reference lines 3 at the semiconductor substrate 1 at which the semiconductor element is to be mounted are recognized by using, for instance, a television camera, and the semiconductor element 2 is secured at a specific position near the center of the circuit forming surface at the semiconductor substrate 1 with a high degree of accuracy by using the adhesive or the like so as to align the three corners of the semiconductor element 2 onto the reference lines 3.

In the embodiment, the reference lines are formed on the circuit forming surface of the semiconductor substrate in correspondence to the three corners of the semiconductor element, and thus, the mounting position at which the semiconductor element is to be mounted can be determined with a higher degree of accuracy with, for instance, a TV camera.

Next, the electrode portions 4 at the semiconductor element 2 accurately secured onto the semiconductor substrate 1 are electrically connected to the pad electrodes 5 on the substrate 1 at the semiconductor device main body through the wirings 6 which may be, for instance, gold wires.

Subsequently, the specific area containing the semiconductor element and the pad electrodes at the periphery of the substrate is sealed with resin (not shown) as in the semiconductor device in the related art. In addition, the ball electrodes (not shown) which may be constituted of solder are formed at specific positions at the lower surface of the semiconductor substrate, thereby completing the process of manufacturing the semiconductor device in the embodiment.

In the embodiment described above in which reference lines are formed in alignment with the three corners of the semiconductor element on the circuit forming surface of the semiconductor substrate, it is possible to verify the correct position at which the semiconductor element is to be mounted with a higher degree of accuracy by utilizing, for instance, a TV camera. As a result, the semiconductor element can be mounted at the correct position with a higher degree of accuracy simply by aligning the corners of the semiconductor element to the reference lines. It is to be noted that since these reference lines indicate the positions at which the three corners of the semiconductor element of any of varying sizes should be set, the semiconductor element can be accurately mounted at the correct mounting position simply by positioning the three corners of the semiconductor element in the vicinity of the reference lines as long as the semiconductor element has a roughly square shape or a rectangular shape.

Second Embodiment

The structure adopted in the semiconductor device in the second embodiment is now explained in reference to FIG. 2. FIG. 2 presents top views of the structure of the semiconductor device achieved in the embodiment.

Figure 2A:
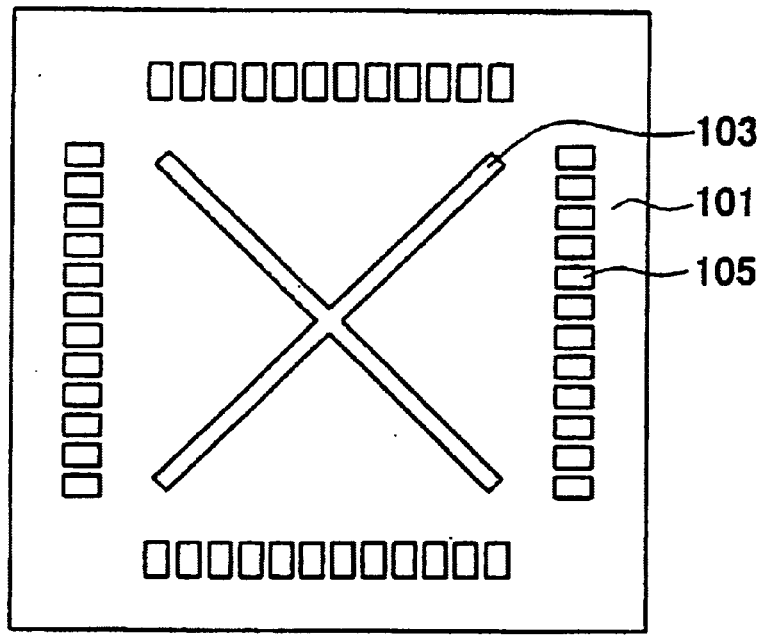
FIGS. 2(a) and 2(b) presents top views of the structure adopted in the semiconductor device achieved in a second embodiment.

Unlike in the first embodiment, a cross mark 103 indicating the positions of the four corner of a semiconductor element 102 to be mounted is formed at the surface of a substrate 101 constituting the semiconductor device main body on the diagonals extending toward the corners of the device through silk-screen printing or the like, as illustrated in FIG. 2(a).

Figure 2B:
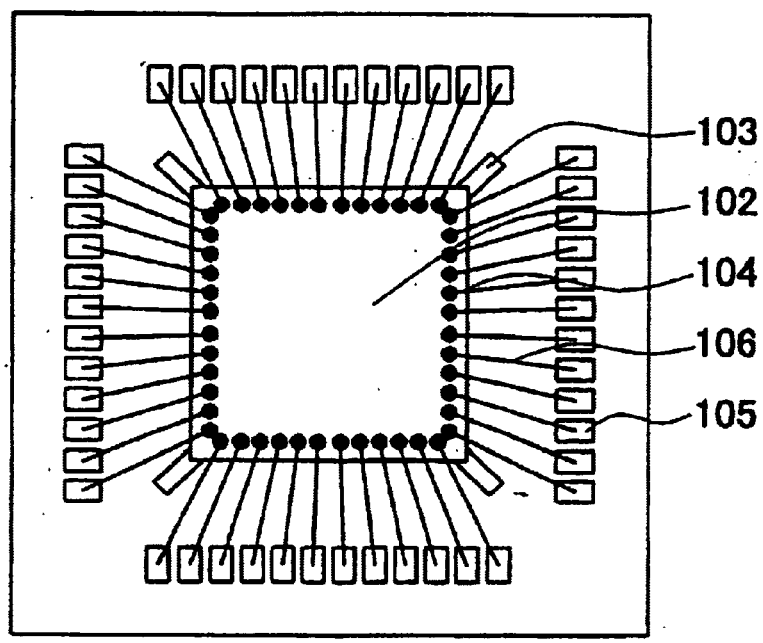

In addition, as illustrated in FIG. 2(b), the semiconductor element 102 is mounted at a specific position near the center of the surface of the substrate 101 constituting the semiconductor device main body by using the cross mark 103 for reference with, for instance, adhesive, achieving a higher degree of accuracy. Electrode portions 104 of the mounted semiconductor element 102 and pad electrodes 105 on the substrate at the semiconductor device main body are electrically connected with each other via wirings 106. As in the semiconductor device in the related art, a specific area containing the semiconductor element is sealed with resin (not shown), with ball electrodes (not shown) which may be constituted of solder or the like formed at specific positions at the lower surface of the semiconductor device substrate.

Next, the semiconductor device manufacturing method achieved in the embodiment is explained.

First, as illustrated in FIG. 2(a), the cross mark 103 indicating the positions of the corners of the semiconductor element 102 to be mounted is formed at the surface of the substrate 101 constituting the semiconductor device main body on the diagonals extending toward the corners of the device through silk-screen printing or the like, unlike in the first embodiment. Then, an adhesive is applied onto a specific area in order to secure the semiconductor element 102 at the mounting area over which the semiconductor element 102 is to be mounted (not shown).

Next, as shown in FIG. 2(b), the cross mark 103 at the semiconductor substrate 101 at which the semiconductor element is to be mounted is recognized by using, for instance, a television camera, and the semiconductor element 102 is secured at a specific position near the center of the circuit forming surface at the semiconductor substrate 101 with a high degree of accuracy by using the adhesive or the like so as to align the corners of the semiconductor element 102 on the cross mark 103.

In the embodiment, the cross mark is formed on the circuit forming surface of the semiconductor substrate in correspondence to the corners of the semiconductor element, and thus, the mounting position at which the semiconductor element is to be mounted can be determined with a higher degree of accuracy with, for instance, a TV camera.

Next, the electrode portions 104 at the semiconductor element 102 accurately secured onto the semiconductor substrate 101 are electrically connected to the pad electrodes 105 on the substrate 101 at the semiconductor device main body through the wirings 106 which may be, for instance, gold wires.

Subsequently, the specific area containing the semiconductor element and the pad electrodes at the periphery of the substrate is sealed with resin (not shown) as in the semiconductor device in the related art. In addition, the ball electrodes (not shown) which may be constituted of solder are formed at specific positions at the lower surface of the semiconductor substrate, thereby completing the process of manufacturing the semiconductor device in the embodiment.

In the embodiment described above in which a cross mark is formed in alignment with the corners of the semiconductor element on the circuit forming surface of the semiconductor substrate, it is possible to verify the correct position at which the semiconductor element is to be mounted with a higher degree of accuracy by utilizing, for instance, a TV camera. As a result, the semiconductor element can be mounted at the correct position with an even higher degree of accuracy simply by aligning the corners of the semiconductor element onto the cross marks compared to the first embodiment. It is to be noted that since this cross mark indicates the positions at which the corners of the semiconductor element of any of varying sizes should be set, the semiconductor element can be accurately mounted at the correct mounting position simply by positioning the corners of the semiconductor element in the vicinity of the cross mark as long as the semiconductor element has a roughly square shape or a rectangular shape.

Third Embodiment

Next, the semiconductor device in the third embodiment is explained in reference to FIG. 3. FIG. 3 presents top views of the structure of the semiconductor device achieved in the embodiment.

Figure 3A:
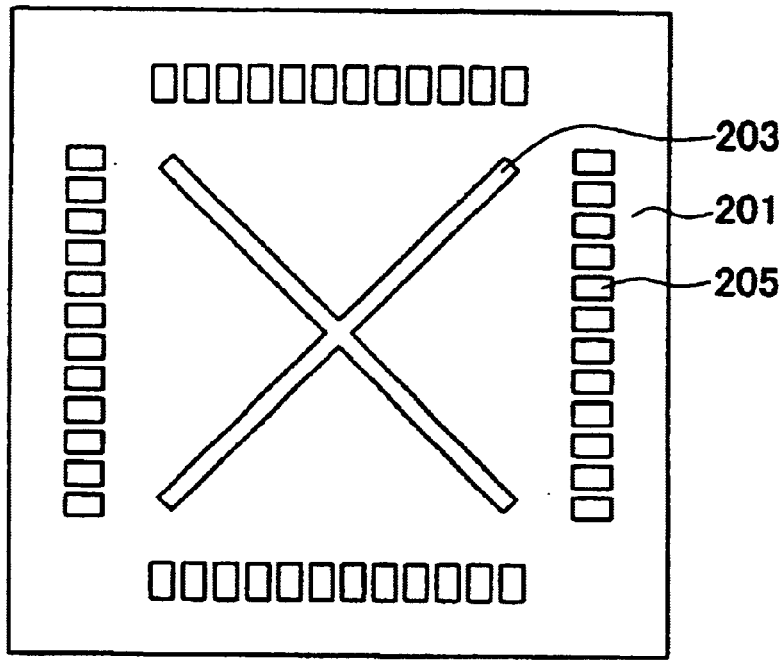
FIGS. 3(a) and 3(b) presents top views of the structure adopted in the semiconductor device achieved in a third embodiment.

As shown in FIG. 3(a), a cross mark 203 is formed on the diagonals extending toward the corners of the device at the surface of a substrate 201 constituting the semiconductor device main body, as in the second embodiment. However, unlike in the second embodiment, the cross mark 203 is formed of an adhesive applied over, for instance, a 20–30 μm thickness in the embodiment.

Figure 3B:
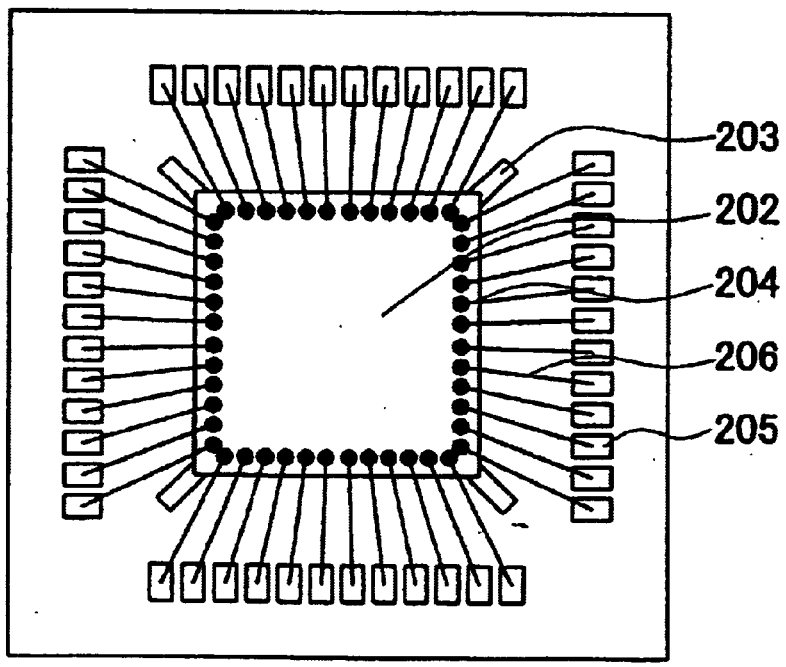

In addition, as illustrated in FIG. 3(b), a semiconductor element 202 is mounted at a specific position near the center of the surface of the substrate 201 constituting the semiconductor device main body with a high degree of accuracy by using the cross mark 203 constituted of the adhesive for reference. Electrode portions 204 of the mounted semiconductor element 202 and pad electrodes 205 on the substrate 201 at the semiconductor device main body are electrically connected with each other via wirings 206. As in the semiconductor device in the related art, a specific area containing the semiconductor element 202 is sealed with resin (not shown), with ball electrodes (not shown) which may be constituted of solder or the like formed at specific positions at the lower surface of the semiconductor device substrate 201.

Next, the semiconductor device manufacturing method achieved in the embodiment is explained.

First, the cross mark 203 indicating the positions of the corners at the semiconductor element to be mounted is formed by applying an adhesive onto the diagonals extending toward the corners of the device at the surface of the substrate 201 constituting the semiconductor device main body.

Next, as shown in FIG. 3(b), the cross mark 203 at the semiconductor substrate 201 at which the semiconductor element is to be mounted is recognized by using, for instance, a television camera, and the semiconductor element 202 is secured at a specific position near the center of the circuit forming surface at the semiconductor device substrate with a high degree of accuracy so as to align the corners of the semiconductor element 202 onto the cross mark 203. Since the cross mark 203 constituted of the adhesive has been formed over the area at which the semiconductor element 202 is to be mounted, the semiconductor element 202 can be secured onto the semiconductor substrate 201 at the correct position with a higher degree of accuracy.

Since the cross mark is constituted of an adhesive in the embodiment, it is not necessary to implement a step for forming a cross mark through, for instance, silk-screen printing, to achieve simplification in the manufacturing process. In addition, the cross mark constituted of the adhesive makes it possible to determine the semiconductor element mounting position with a higher degree of accuracy.

Next, the electrode portions 204 at the semiconductor element 202 accurately secured onto the semiconductor device substrate 201 are electrically connected to the pad electrodes 205 on the substrate 201 at the semiconductor device main body through the wirings 206 which may be, for instance, gold wires.

Subsequently, the specific area containing the semiconductor element 202 and the pad electrodes at the periphery of the substrate is sealed on the semiconductor substrate 201 with resin (not shown) as in the semiconductor device in the related art. In addition, the ball electrodes (not shown) which may be constituted of solder are formed at specific positions at the lower surface of the semiconductor substrate 201, thereby completing the process of manufacturing the semiconductor device in the embodiment.

The embodiment in which a reference lines are formed from an adhesive makes it possible to omit a step for forming reference lines through silk-screen printing or the like, thereby achieving a simpler manufacturing process. In addition, since reference lines constituted of an adhesive is formed in alignment with the corners of the semiconductor element to be mounted on the substrate constituting the semiconductor device main body, the semiconductor element mounting position can be determined with a higher degree of accuracy.

Fourth Embodiment

Next, the semiconductor device in the fourth embodiment is explained in reference to FIG. 4. FIG. 4 presents top views of the structure of the semiconductor device achieved in the embodiment.

Figure 4A:
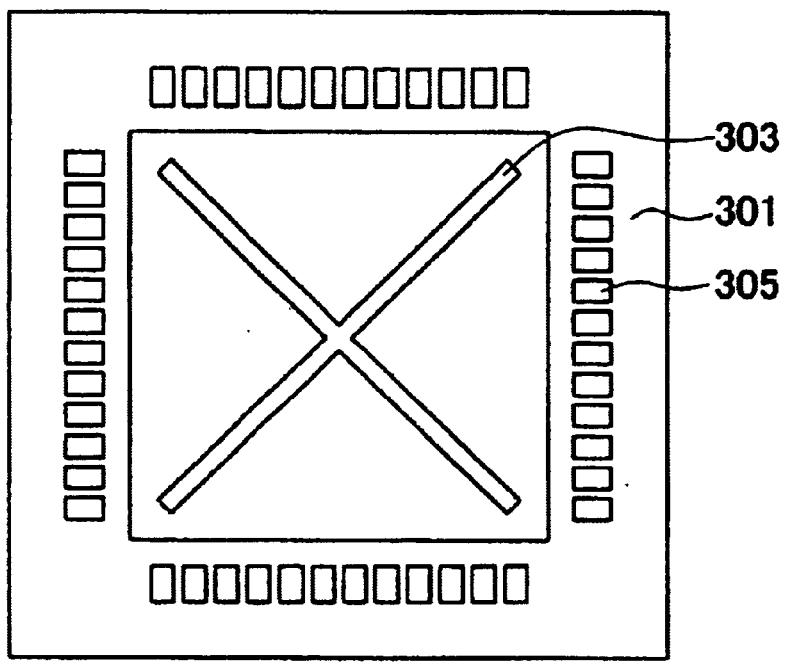
FIGS. 4(a) and 4(b) presents top views of the structure adopted in the semiconductor device achieved in a fourth embodiment.

First, as shown in FIG. 4(a), a cross mark 303 is formed on the diagonals extending toward the corners of the device at the surface of a substrate 301 constituting the semiconductor device main body. Unlike in the preceding embodiments, the cross mark 303 is formed during the step in which pad electrodes 305 constituted of, for instance, Cu are formed at the periphery of the substrate.

Figure 4B:
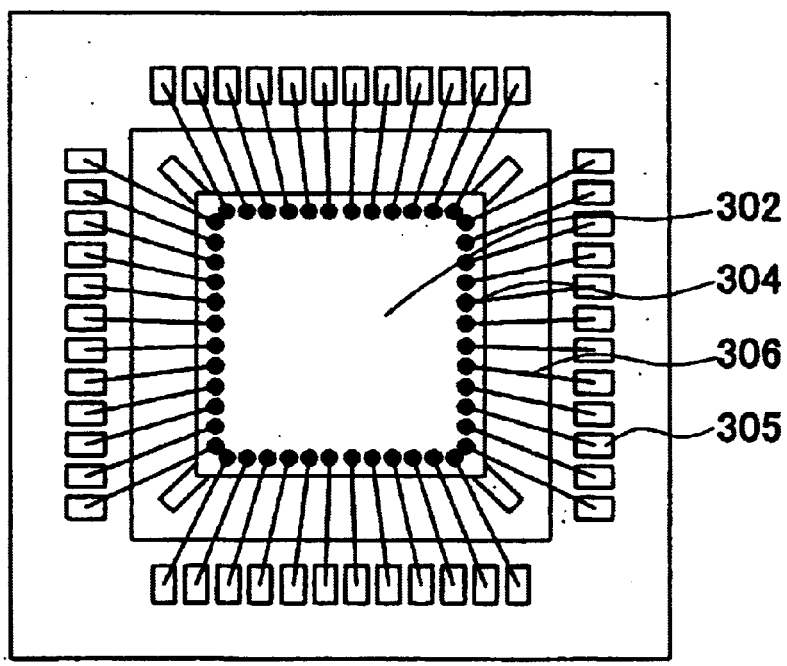

In addition, as illustrated in FIG. 4(b), a semiconductor element 302 is mounted at a specific position near the center of the surface of the substrate 301 constituting the semiconductor device main body by using the cross mark 303 for reference and is secured with, for instance, an adhesive, achieving a higher degree of accuracy. Electrode portions 304 of the mounted semiconductor element 302 and pad electrodes 305 on the substrate 301 at the semiconductor device main body are electrically connected with each other via wirings 306. As in the semiconductor device in the related art, a specific area containing the semiconductor element 302 is sealed with resin (not shown), with ball electrodes (not shown) which may be constituted of solder or the like formed at specific positions at the lower surface of the semiconductor device substrate 301.

Next, the semiconductor device manufacturing method achieved in the embodiment is explained.

First, as shown in FIG. 4(a), a metal film for pad electrode formation constituted of, for instance, Cu and achieving a 15 μm thickness, is formed over the entire circuit forming surface of the semiconductor substrate 301. Next, a masking pattern to be used to form the pad electrodes 305 and the cross mark 303 is formed on the Cu film. Almost concurrently, while forming the pad electrodes 305 by removing the Cu film through etching, the cross mark 303 constituted of an area where the Cu film has been removed through etching is formed. It is to be noted that the cross mark 303 is formed on the diagonals extending toward the corners of the device 301.

Unlike in the preceding embodiments, the cross mark is formed almost concurrently while forming the pad electrodes constituted of, for instance, Cu at the periphery of the substrate by using the masking pattern formed in the shape of the cross mark and etching the Cu film.

Next, as shown in FIG. 4(b), the cross mark 303 at the semiconductor substrate 301 at which the semiconductor element is to be mounted is recognized by using, for instance, a television camera, and the semiconductor element 302 is secured at a specific position near the center of the circuit forming surface at the semiconductor substrate 302 with a high degree of accuracy by using the adhesive or the like so as to align the corners of the semiconductor element 302 onto the cross mark 303.

This embodiment, in which the cross mark is formed almost concurrently with the formation of the pad electrodes during the substrate circuit forming process, simplifies the manufacturing process. In addition, since it is not necessary to implement a cross mark forming step through silk-screen printing or the like, further simplification in the manufacturing process is achieved.

Next, the electrode portions 304 at the semiconductor element 302 accurately secured onto the semiconductor substrate 301 are electrically connected to the pad electrodes 305 on the substrate 301 at the semiconductor device main body through the wirings 306 which may be, for instance, gold wires.

Subsequently, the specific area containing the semiconductor element 302 and the pad electrodes at the periphery of the substrate is sealed with resin (not shown) as in the semiconductor device in the related art. In addition, the ball electrodes (not shown) which may be constituted of solder are formed at specific positions at the lower surface of the semiconductor substrate 301, thereby completing the process of manufacturing the semiconductor device in the embodiment.

The embodiment, in which reference lines are formed almost concurrently with the formation of the pad electrodes on the substrate of the semiconductor device main body during the substrate circuit forming process, simplifies the manufacturing process. Furthermore, since it is not necessary to implement a reference line forming step through silk-screen printing or the like, further simplification of the manufacturing process is achieved.

Fifth Embodiment

Next, the semiconductor device in the fifth embodiment is explained in reference to FIG. 5. FIG. 5 presents top views of the structure of the semiconductor device achieved in the embodiment.

Figure 5A:
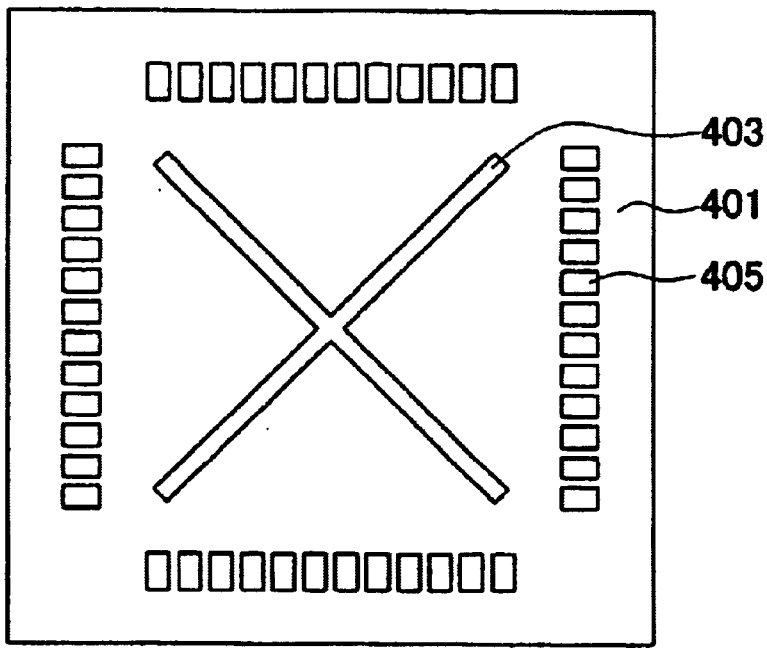
FIGS. 5(a) and 5(b) presents top views of the structure adopted in the semiconductor device achieved in a fifth embodiment.

First, as shown in FIG. 5(a), a cross mark 403 is formed on the diagonals extending toward the corners of the device at the surface of a substrate 401 constituting the semiconductor device main body. Unlike in the fourth embodiment, the cross mark 403 is formed of an unetched area (i.e., constituted of the material constituting the pad electrodes) in this embodiment. In addition, the surface of the cross mark is treated through Au plating or the like in the embodiment.

Figure 5B:
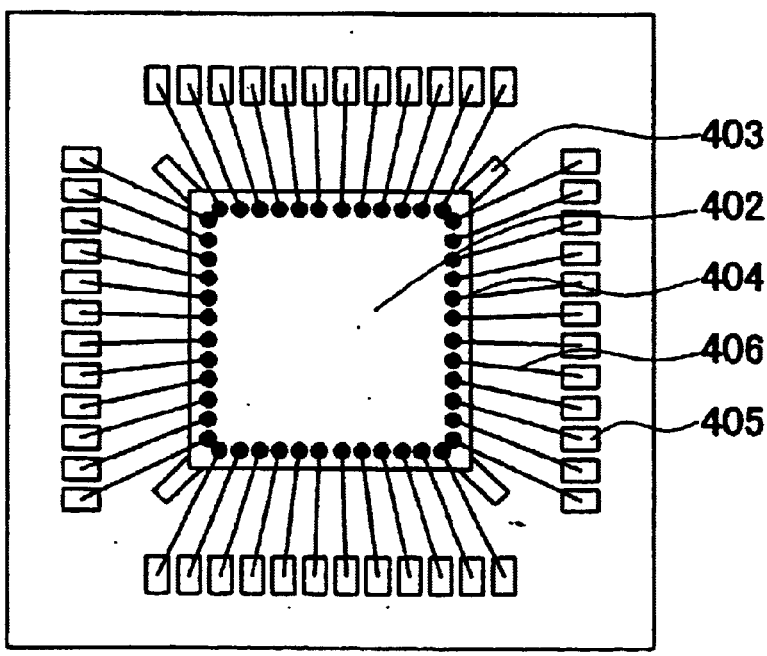

As illustrated in FIG. 5(b), a semiconductor element 402 is mounted at a specific position near the center of the surface of the substrate 401 constituting the semiconductor device main body by using the cross mark 403 for reference and is secured with, for instance, an adhesive, achieving a higher degree of accuracy. Electrode portions 404 of the mounted semiconductor element 402 and pad electrodes 405 on the substrate 401 at the semiconductor device main body are electrically connected with each other via wirings 406. As in the semiconductor device in the related art, a specific area containing the semiconductor element 402 is sealed with resin (not shown), with ball electrodes (not shown) which may be constituted of solder or the like formed at specific positions at the lower surface of the semiconductor device substrate.

Next, the semiconductor device manufacturing method achieved in the embodiment is explained.

First, as shown in FIG. 5(a), a metal film for pad electrode formation constituted of, for instance, Cu, is formed over the entire circuit forming surface of the semiconductor substrate 401. Next , a masking pattern to be used to form the pad electrodes 405 and the cross mark 403 is formed on the Cu film. Almost concurrently, while forming the pad electrodes 405 by removing the Cu film through etching, the cross mark 403 constituted of an area where the Cu film remains unetched is formed. It is to be noted that the cross mark 403 is formed on the diagonals extending toward the corners of the device. Then, an adhesive is applied onto the area over which the semiconductor element is to be mounted.

Unlike in the fourth embodiment, the cross mark in the embodiment is formed by leaving the Cu film unetched. Also, the surface of the cross mark is treated through Au plating or the like.

Next, as shown in FIG. 5(b), the cross mark 403 at the semiconductor substrate 401 is recognized by using, for instance, a television camera, and the semiconductor element 402 is mounted at a specific position near the center of the circuit forming surface at the semiconductor substrate 401 with a high degree of accuracy by aligning the corners of the semiconductor element 402 onto the cross mark 403. At this time, the semiconductor element 402 is secured at the correct position on the semiconductor substrate with an even higher degree of accuracy with the adhesive having been applied onto the semiconductor element mounting area.

The embodiment, in which the surface of the cross mark is treated through Au plating or the like unlike in the fourth embodiment, improves the accuracy of the image recognition which is implemented to verify the position at which the semiconductor element is to be secured.

Next, the electrode portions 404 at the semiconductor element 402 accurately secured onto the semiconductor substrate 401 are electrically connected to the pad electrodes 405 on the substrate 401 at the semiconductor device main body through the wirings 406 which may be, for instance, gold wires.

Subsequently, the specific area on the semiconductor substrate 401 containing the semiconductor element 402 and the pad electrodes at the periphery of the substrate 401 is sealed with resin (not shown) as in the semiconductor device in the related art. In addition, the ball electrodes (not shown) which may be constituted of solder are formed at specific positions at the lower surface of the semiconductor substrate, thereby completing the process of manufacturing the semiconductor device in the embodiment.

The embodiment, in which the surfaces of the reference lines are treated through Au plating or the like unlike in the fourth embodiment improves the accuracy with which the image recognition is implemented to verify the position at which the semiconductor element is to be secured.

Sixth Embodiment

Next, the semiconductor device in the sixth embodiment is explained in reference to FIGS. 6 and 7. FIG. 6 presents top views of the structure of the semiconductor device achieved in the embodiment.

Figure 6A:
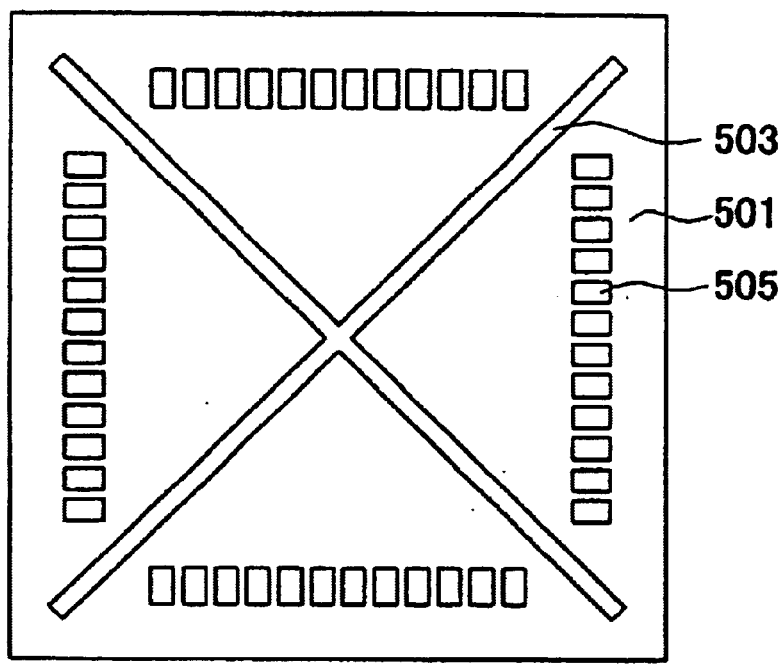
FIGS. 6(a) and 6(b) presents top views of the structure adopted in the semiconductor device achieved in a sixth embodiment.

First, as shown in FIG. 6(a), a cross mark 503 extending to the outside of a resin-sealed area at the surface of the device is formed on the diagonals extending toward the corners of the device at the surface of a substrate 501 constituting the semiconductor device main body, unlike in the fifth embodiment.

Figure 6B:
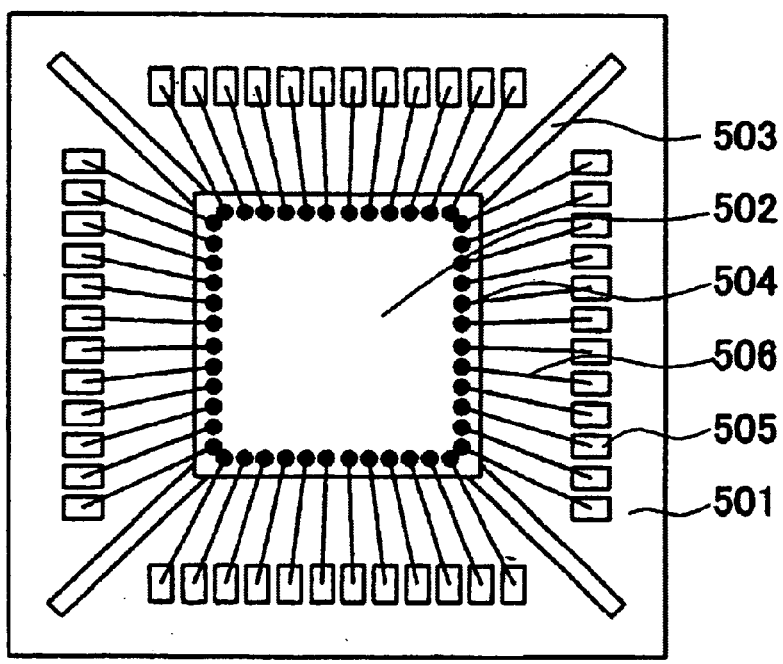

In addition, as illustrated in FIG. 6(b), a semiconductor element 502 is mounted at a specific position near the center of the surface of the substrate 501 constituting the semiconductor device main body by using the cross mark 503 for reference and is secured with, for instance, an adhesive, achieving a higher degree of accuracy. Electrode portions 504 of the mounted semiconductor element 502 and pad electrodes 505 on the substrate at the semiconductor device main body are electrically connected with each other via wirings 506. As shown in FIG. 7, a specific area containing the semiconductor element 502 on the semiconductor substrate 501 is sealed with resin 507, with ball electrodes 508 which may be constituted of solder or the like formed at specific positions at the lower surface of the semiconductor device substrate 501 as in the semiconductor in the related art.

Next, the semiconductor device manufacturing method achieved in the embodiment is explained.

First, as shown in FIG. 6(a), a metal film constituted of, for instance, Cu, for pad electrode formation is formed over the entire circuit forming surface of the semiconductor substrate 501. Next, a masking pattern to be used to form the pad electrodes 502 and the cross mark 503 is formed on the Cu film. Almost concurrently with the formation of the pad electrodes 502 by removing the Cu film through etching, the 503 constituted of an area where the Cu film remains unetched is formed to extend to the outside of the resin-sealed area at the device surface. It is to be noted that the cross mark 503 is formed on the diagonals extending toward the corners of the device.

The cross mark 503 in the embodiment is formed to extend to the outside of the resin-sealed area at the device surface. In addition, the surface of the cross mark 503 is treated through Au plating or the like as in the fifth embodiment.

An adhesive is applied onto the semiconductor element mounting area of the semiconductor substrate 501.

Next, as shown in FIG. 6(b), the cross mark 503 at the semiconductor substrate 501 at which the semiconductor element is to be mounted is recognized by using, for instance, a television camera, and the semiconductor element 502 is mounted at a specific position near the center of the circuit forming surface at the semiconductor substrate 501 with a higher degree of accuracy by aligning the three corners of the semiconductor element 502 onto the cross mark 503. At this time, the semiconductor element 502 is secured at the correct position on the semiconductor substrate 501 with an even higher degree of accuracy with the adhesive having been applied onto the semiconductor element mounting area.

Next, the electrode portions 504 at the semiconductor element 502 accurately secured onto the semiconductor substrate 501 are electrically connected to the pad electrodes 505 on the substrate 501 at the semiconductor device main body through the wirings 506 which may be, for instance, gold wires.

Figure 7A:
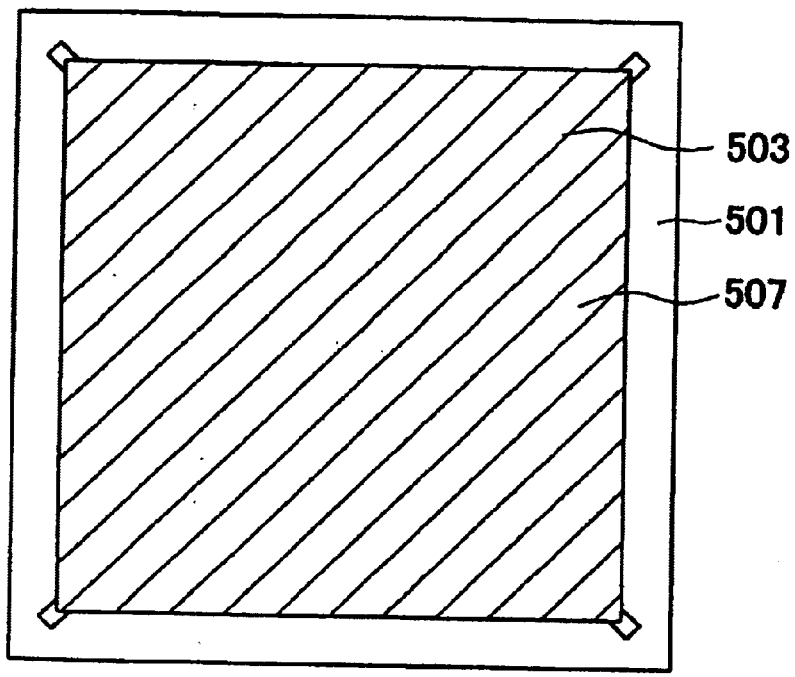
FIGS. 7(a) and 7(b) illustrates the structure of the semiconductor device in the sixth embodiment.

Next, as illustrated in FIG. 7(a), the specific area containing the semiconductor element and the pad electrodes at the peripheral area of the substrate is sealed with the resin 507 as in the semiconductor device in the related art. The cross mark 503 in the embodiment is formed to extend to the outside of the resin-sealed area at the device surface.

Figure 7B:
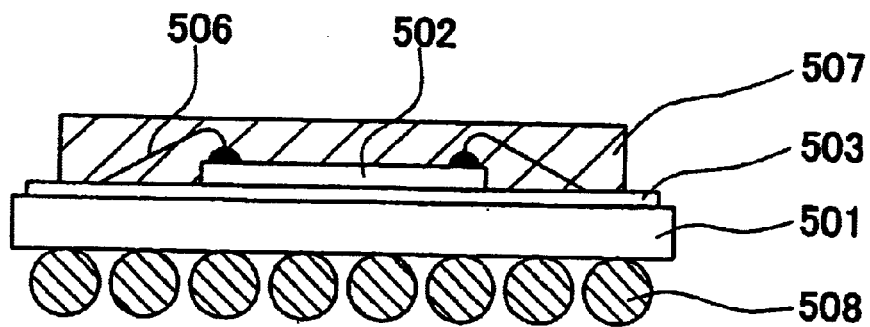

Then, as shown in FIG. 7(b), the ball electrodes 508 which may be constituted of solder are formed at specific positions at the lower surface of the semiconductor device substrate 501, thereby completing the process of manufacturing the semiconductor device in the embodiment.

In the embodiment, a state of subtle separation from the sealed surface is achieved by the reference lines and the Au plate extending to the external periphery of the resin-sealed area, thereby realizing an effect (the so-called vent effect) that lessens the evaporation stress caused by the impregnating water by releasing the evaporating water to eliminate the problem of so-called popcorn cracks, which tend to occur in the reflow mounting process normally adopted when mounting semiconductor elements at a motherboard. In addition, since an Au plate, for instance, is formed on the surface of the reference lines, the accuracy with which the image recognition is implemented to verify the semiconductor element mounting position improves.

Seventh Embodiment

Figure 8A:
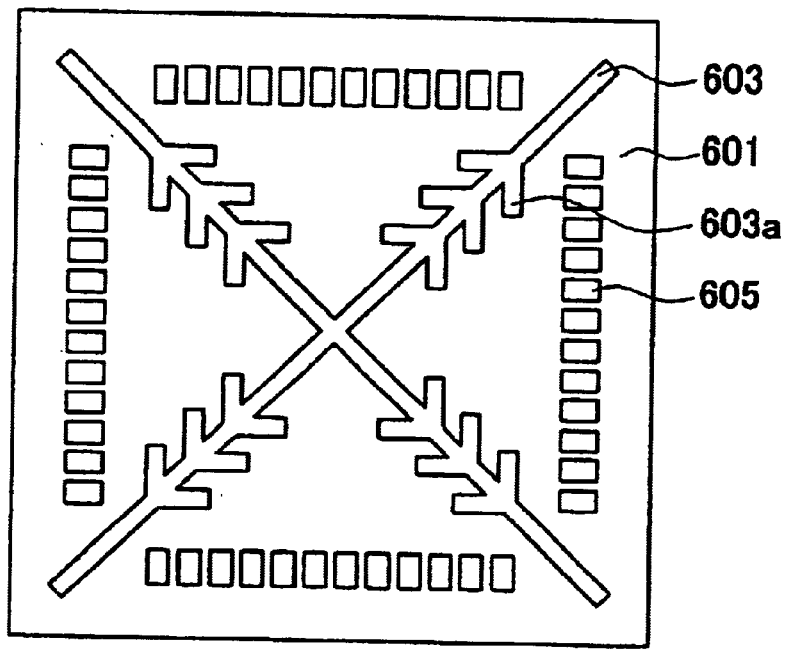
FIGS. 8(a) and 8(b) presents top views of the structure adopted in the semiconductor device achieved in a seventh embodiment.
Figure 8B:
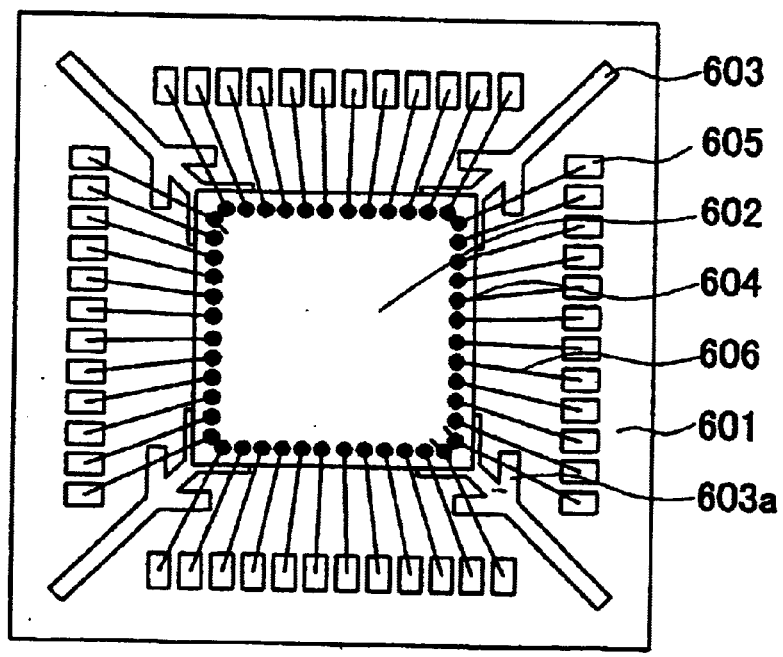

Next, the seventh embodiment is explained in reference to FIG. 8. FIG. 8 presents top views of the structure adopted in the semiconductor device in the embodiment.

Unlike in the sixth embodiment, ribs 603a are formed at a plurality of positions corresponding to varying sizes of semiconductor elements to be mounted at a cross mark 603 formed on the diagonals extending toward the corners of the device at the surface of a substrate 601 constituting the semiconductor device main body, as illustrated in FIG. 8(*a*).

In addition, as shown in FIG. 8(*b*), a semiconductor element 602 is mounted at a specific position near the center of the surface of the substrate 601 constituting the semiconductor device main body by using the cross mark 603 and the ribs 603*a* for reference and is secured with, for instance, an adhesive achieving a higher degree of accuracy. Electrode portions 604 at the mounted semiconductor element 602 are electrically connected to pad electrodes 605 on the substrate 601 constituting the semiconductor device main body via wirings 606. As in the semiconductor device in the related art, a specific area containing the semiconductor element 602 on the semiconductor substrate 601 is sealed with resin (not shown) and ball electrodes (not shown) which may be constituted of solder are formed at specific positions at the lower surface of the semiconductor device substrate 601.

Next, the method adopted to manufacture the semiconductor device in the embodiment is explained.

First, as illustrated in FIG. 8(*a*), a metal film which may be constituted of, for instance, Cu for pad electrode formation is formed over the entire circuit forming surface of the semiconductor substrate. Next, a masking pattern to be used to form the pad electrodes 605 and the cross mark 603 including the ribs 603*a* is formed on the Cu film. Then, almost concurrently with the formation of the pad electrodes 605 implemented by removing the Cu film through etching, the cross mark 603 having the ribs 603*a* constituted of an area where the Cu film remains unetched is formed to extend to the outside of the resin-sealed area at the device surface. It is to be noted that the cross mark 603 having the ribs 603*a* is formed on the diagonals extending toward the corners of the device.

Unlike in the sixth embodiment, the ribs 603*a* matching varying sizes of semiconductor elements 602 to be mounted are formed at a plurality of positions at a cross mark 603 in the embodiment.

In addition, an adhesive is applied onto the semiconductor element mounting area at the semiconductor substrate 601.

Next, as shown in FIG. 7(*b*), the ribs 603*a* and the cross mark 603 at the semiconductor substrate on which the semiconductor element is to be mounted are verified with, for instance, a television camera and the semiconductor element 602 is secured onto a specific position near the center of the circuit forming surface of the semiconductor substrate 601 with a higher degree of accuracy by setting the corners of the semiconductor element 602 in alignment with the ribs 603*a* on the cross mark 603. Since the adhesive has been applied to the semiconductor element mounting area, the semiconductor element 602 can be secured to the correct position on the semiconductor substrate 601 with accuracy at this time.

It is to be noted that the ribs should be formed in conformance to varying sizes of semiconductor elements, to make it possible to mount semiconductor elements of varying sizes with a high degree of accuracy in conformance to their individual sizes at a common semiconductor device.

Next, the electrode portions 604 at the semiconductor element 602 accurately secured onto the semiconductor substrate 601 are electrically connected to the pad electrodes 605 on the substrate 601 at the semiconductor device main body through the wirings 606 which may be, for instance, gold wires. Subsequently, the specific area on the semiconductor device 601 containing the semiconductor element 602 and the pad electrodes at the periphery of the substrate is sealed with resin (not shown) as in the semiconductor device in the related art. In addition, the ball electrodes (not shown) which may be constituted of solder are formed at specific positions at the lower surface of the semiconductor device substrate 601, thereby completing the process of manufacturing the semiconductor device in the embodiment.

Since ribs are formed at positions corresponding to varying sizes of semiconductor elements that can be mounted at the device in the embodiment, semiconductor elements can be mounted at the correct positions with further accuracy. Moreover, by forming ribs at positions corresponding to the maximum and minimum sizes of elements that can be mounted at the device, the ribs can be used for reference when making a decision as to whether or not a given semiconductor element can be mounted at the device.

Eighth Embodiment

Figure 9A:
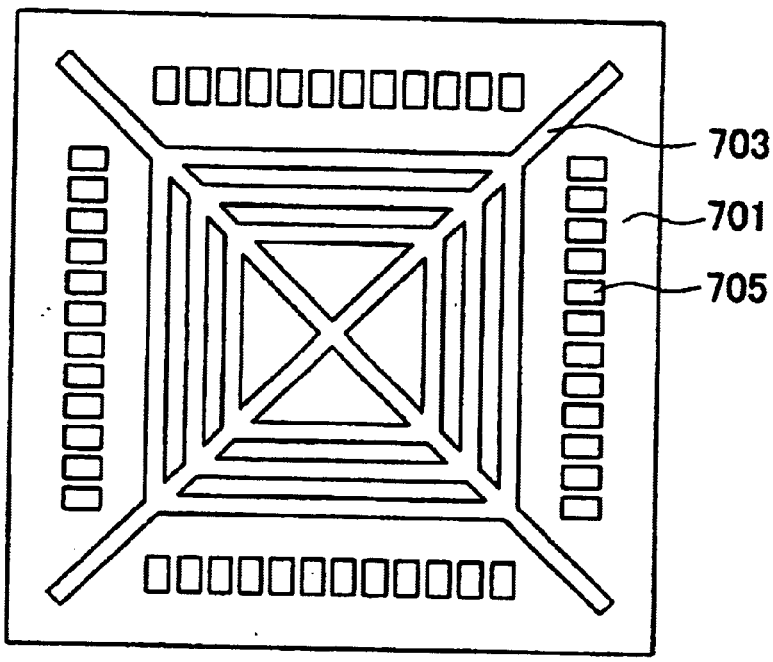
FIGS. 9(a) and 9(b) presents top views of the structure adopted in the semiconductor device achieved in an eighth embodiment.
Figure 9B:
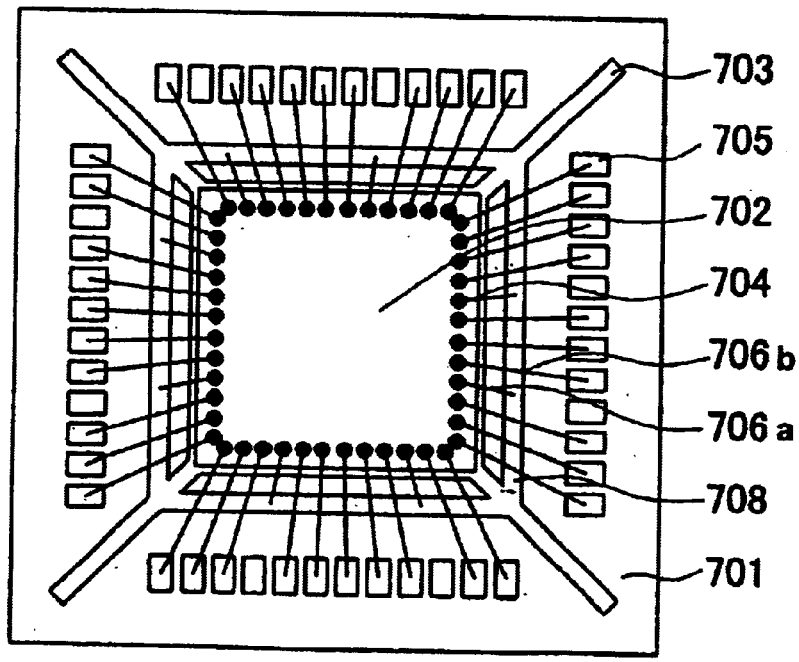
Figure 10A:
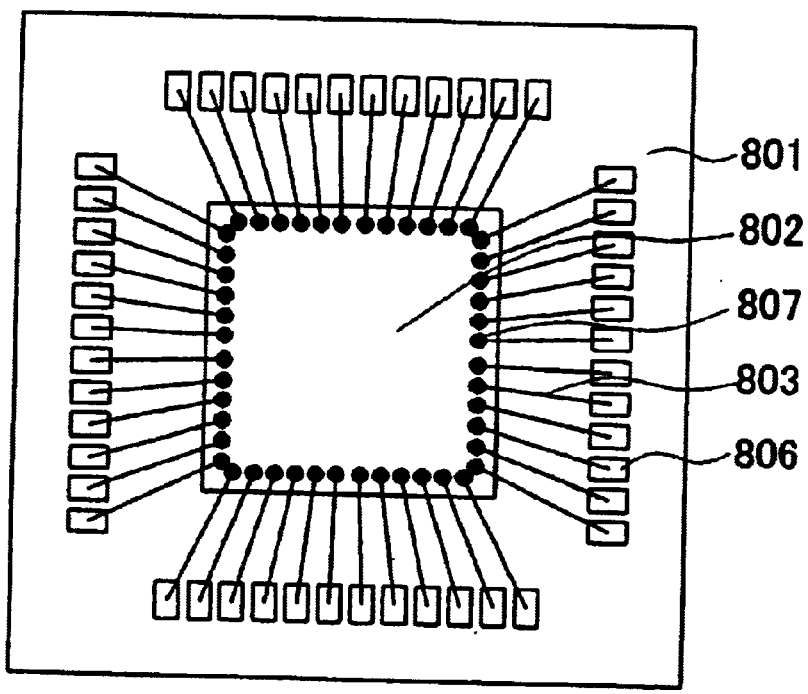
FIGS. 10(a) and 10(b) presents top views of the structure adopted in the semiconductor device in the related art.
Figure 10B:
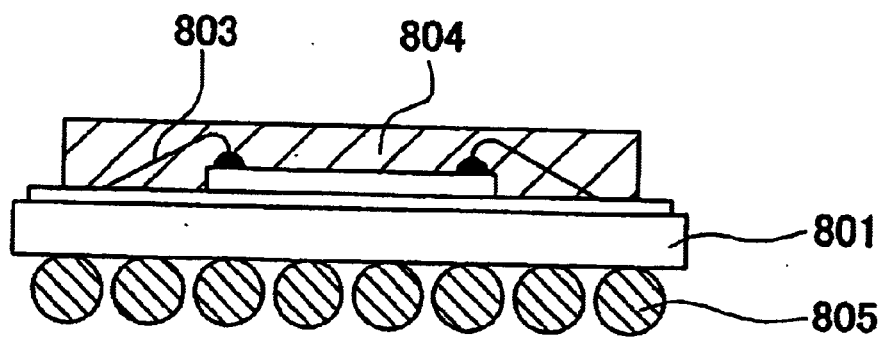

Next, the eighth embodiment of the present invention is explained in reference to FIG. 9. FIG. 9 presents top views of the structure adopted in the semiconductor device in the embodiment.

Unlike in the seventh embodiment, and frame portions 708 corresponding to varying sizes of semiconductor elements 702 to be mounted are formed at a cross mark 703 formed on the diagonals extending toward the corners of the device at the surface of a substrate 701 constituting the semiconductor device main body, as illustrated in FIG. 9(*a*).

In addition, as shown in FIG. 9(*b*), a semiconductor element 702 is mounted at a specific position near the center of the surface of the substrate 701 constituting the semiconductor device main body by using the cross mark 703 and a frame portion 708 for reference and is secured with, for instance, an adhesive achieving a higher degree of accuracy. Electrode portions 704 at the mounted semiconductor element 702 are electrically connected to pad electrodes 705 on the substrate 701 constituting the semiconductor device main body via wirings 706*a* and 706*b*. As in the semiconductor device in the related art, a specific area containing the semiconductor element 702 on the semiconductor substrate 701 is sealed with resin (not shown) and ball electrodes (not shown) which may be constituted of solder are formed at specific positions at the lower surface of the semiconductor device substrate 701.

Next, the method adopted to manufacture the semiconductor device in the embodiment is explained.

First, as illustrated in FIG. 9(*a*), a metal film which may be constituted of, for instance, Cu for pad electrode formation is formed over the entire circuit forming surface of the semiconductor substrate 701. Next, a masking pattern to be used to form the pad electrodes 705 and the cross mark 703 including the frame portions 708 is formed on the Cu film. Then, almost with the formation of the pad electrodes 705 implemented by removing the Cu film through etching the frame portion 708 and the cross mark 703 formed over an area where the Cu film remains unetched extend to the outside of the resin-sealed area at the device surface. It is to be noted that the cross mark 703 is formed on the diagonals extending toward the corners of the device.

Unlike in the seventh embodiment, the frame portions 708 are formed at a plurality of positions at the cross mark 703 in the embodiment.

In addition, an adhesive is applied onto the semiconductor element mounting area at the semiconductor substrate 701.

Next, as shown in FIG. 9(*b*), the frame portion 708 and the cross mark 703 at the semiconductor substrate 701 on which the semiconductor element is to be mounted are verified with, for instance, a television camera and the semiconductor element 702 is secured onto a specific position near the center of the circuit forming surface of the semiconductor substrate 701 with accuracy by setting the corners of the semiconductor element 702 on the frame portion 708 and the cross mark 703. Since the adhesive has been applied to the semiconductor element mounting area on the semiconductor substrate 701, the semiconductor element 702 can be secured to the correct position on the semiconductor substrate with accuracy at this time.

It is to be noted that the frame portions should be formed in conformance to varying sizes of semiconductor elements, to make it possible to mount semiconductor elements of varying sizes with a high degree of accuracy in conformance to their individual sizes at a common semiconductor device.

Next, the electrode portions 704 at the semiconductor element 702 accurately secured onto the semiconductor substrate 701 are electrically connected to the pad electrodes 705 on the substrate 701 at the semiconductor device main body through the wirings 706a and 706b which may be, for instance, gold wires. Subsequently, the specific area on the semiconductor substrate 701 containing the semiconductor element 702 and the pad electrodes at the periphery of the substrate is sealed with resin (not shown) as in the semiconductor device in the related art. In addition, the ball electrodes (not shown) which may be constituted of solder are formed at specific positions at the lower surface of the semiconductor substrate 701, thereby completing the process of manufacturing the semiconductor device in the embodiment.

In the embodiment, the presence of the frame portions formed at the semiconductor substrate prevents the adhesive applied to secure the semiconductor elements from seeping out. In addition, the extent of surface separation caused by popcorn cracks originating at the adhesive can be minimized (the popcorn cracks are prevented from reaching the wire bond points). Moreover, source signals for the semiconductor elements can be connected through wiring to the frame portions and thus stable operation of the elements can be achieved by using a uniform source signal (by using the wiring as a so-called common power wiring or a so-called common ground wiring).

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

While an explanation is given above in reference to the third~ eighth embodiments on an example in which a cross mark indicating the positions of the four corners of the semiconductor element is formed, the present invention may be implemented in a similar manner when adopted in conjunction with three reference lines indicating the positions of three corners instead.

As explained above, according to the present invention in which reference lines indicating the positions of at least three corners of the semiconductor element to be mounted are formed on the circuit forming surface of the semiconductor substrate, the correct semiconductor element mounting position can be determined with a higher degree of accuracy. By mounting the semiconductor element on the semiconductor substrate by aligning the corners of the semiconductor element at the reference lines, the semiconductor element is set at the correct position with accuracy. In addition, since these reference lines indicate the positions at which the corners of a semiconductor element of any of varying sizes that may be mounted should be set, the semiconductor element can be accurately mounted at the correct position simply by positioning the corners of the semiconductor element in the vicinity of the reference lines as long as the semiconductor element has a roughly square shape or a rectangular shape.

What is claimed is:

1. A semiconductor device, comprising:
   a semiconductor substrate having a circuit forming surface, and having a plurality of electrode pads provided on the circuit forming surface, said electrode pads being disposed to surround an area of the circuit forming surface;
   a semiconductor element mounted within the area of the circuit forming surface;
   a plurality of adhesive lines adapted for use as reference lines, said adhesive lines being disposed under the semiconductor element and on the circuit forming surface, and being respectively provided at positions corresponding to at least three corners of the semiconductor element, said adhesive lines being adapted for use as a reference for determining a correct placement of the semiconductor element within the area of the circuit forming surface, said adhesive lines adhering said semiconductor element to the circuit forming surface of said semiconductor substrate; and
   a sealing resin that seals said semiconductor element;
   wherein the reference lines extend beyond and outside an entire area that is sealed by said sealing resin.

2. The semiconductor device recited in claim 1, wherein a portion of the reference lines that extends beyond and outside the area that is sealed by said sealing resin is not covered by said sealing resin.

3. The semiconductor device recited in claim 1, wherein the reference lines include a cross mark, and at least one rib on the cross mark, the rib corresponding to a size of the semiconductor element.

4. The semiconductor device recited in claim 3, wherein the rib is disposed so that when the semiconductor element is in the correct placement within the area of circuit forming surface, the rib is positioned under one of the at least three corners of the semiconductor element.

5. The semiconductor device recited in claim 4, wherein when the rib is positioned under the one of the at least three corners of the semiconductor element, a portion of the rib is covered by the semiconductor element, and a further portion of the rib is not covered by the semiconductor element.

6. The semiconductor device recited in claim 3, wherein the rib and the cross mark form an acute angle.

7. The semiconductor device recited in claim 1, wherein the reference lines include a cross mark, and a plurality of ribs disposed on the cross mark and at different outward positions relative to a center of the cross mark, with each rib corresponding to a different sized semiconductor element.

8. The semiconductor device recited in claim 1, wherein the reference lines include a cross mark, and at least one frame portion at the cross mark, the frame portion corresponding to a size of the semiconductor element.

9. The semiconductor device recited in claim 8, wherein the frame portion is disposed so that when the semiconductor element is in the correct placement within the area of the circuit forming surface, the frame portion is positioned under the at least three corners of the semiconductor element.

10. The semiconductor device recited in claim 9, wherein when the frame portion is positioned under the at least three corners of the semiconductor element, a portion of the frame portion is covered by the semiconductor element, and a further portion of the frame portion is not covered by the semiconductor element.

11. The semiconductor device recited in claim 1, wherein the reference lines include a cross mark, and a plurality of frame portions disposed on the cross mark and at different outward positions relative to a center of the cross mark, with each frame portion corresponding to a differently sized semiconductor element.

12. A semiconductor device, comprising:
- a semiconductor substrate having a circuit forming surface, and having a plurality of electrode pads provided on the circuit forming surface, said electrode pads being disposed to surround an area of the circuit forming surface;
- a semiconductor element mounted within the area of the circuit forming surface;
- a plurality of reference lines disposed under the semiconductor element and on the circuit forming surface, and being respectively provided at positions corresponding to at least three corners of the semiconductor element, said reference lines being adapted for use as a reference for determining a correct placement of the semiconductor element within the area of the circuit forming surface; and
- a sealing resin that seals said semiconductor element;
- wherein the reference lines extend beyond and outside an entire area that is sealed by said sealing resin.

13. The semiconductor device recited in claim 12, wherein the reference lines include a cross mark, and at least one rib on the cross mark, the rib corresponding to a size of the semiconductor element.

14. The semiconductor device recited in claim 13, wherein the rib is disposed so that when the semiconductor element is in the correct placement within the area of the circuit forming surface, the rib is positioned under one of the least three corners of the semiconductor element.

15. The semiconductor device recited in claim 14, wherein when the rib is positioned under the one of the least three corners of the semiconductor element, a portion of the rib is covered by the semiconductor element, and a further portion of the rib is not covered by the semiconductor element.

16. The semiconductor device recited in claim 13, wherein the rib and the cross mark form an acute angle.

17. The semiconductor device recited in claim 12, wherein the reference lines include a cross mark, and a plurality of ribs disposed on the cross mark and at different outward positions relative to a center of the cross mark, with each rib corresponding to a differently sized semiconductor element.

18. The semiconductor device recited in claim 12, wherein the reference lines include a cross mark, and at least one frame portion at the cross mark, the frame portion corresponding to a size of the semiconductor element.

19. The semiconductor device recited in claim 18, wherein the frame portion is disposed so that when the semiconductor element is in the correct placement within the area of the circuit forming surface, the frame portion is positioned under the at least three corners of the semiconductor element.

20. The semiconductor device recited in claim 19, wherein when the frame portion is positioned under the at least three corners of the semiconductor element, a portion of the frame portion is covered by the semiconductor element, and a further portion of the frame portion is not covered by the semiconductor element.

21. The semiconductor device recited in claim 12, wherein the reference lines include a cross mark, and a plurality of frame portions disposed on the cross mark and at different outward positions relative to a center of the cross mark, with each frame portion corresponding to a differently sized semiconductor element.

* * * * *